TRANSISTOR TONE CONTROL CIRCUIT

Filed May 11, 1959

INVENTORS:
Richard E. Campbell
Melvin H. Murphy
By Smyth & Roston
Attorneys

United States Patent Office 3,103,635

Patented Sept. 10, 1963

3,103,635

TRANSISTOR TONE CONTROL CIRCUIT

Richard E. Campbell, Los Angeles, and Melvin H. Murphy, Encino, Calif., assignors to Packard-Bell Electronics Corporation, Los Angeles, Calif., a corporation of California Filed May 11, 1959, Ser. No. 812,424
3 Claims. (Cl. 330—28)

Figure 1:
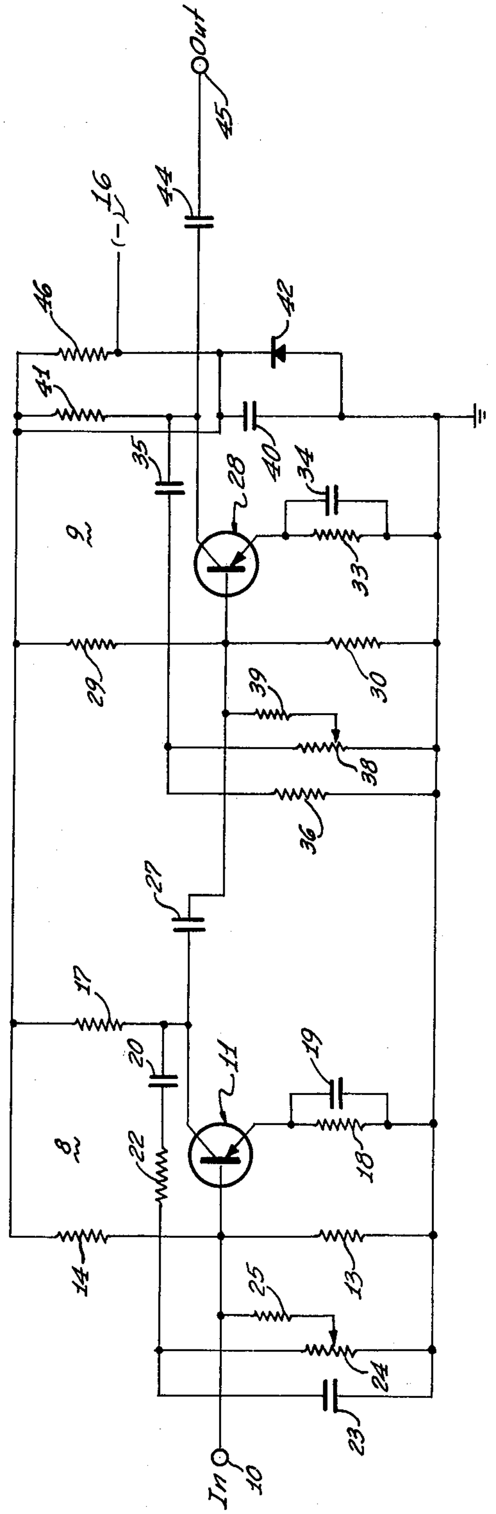

This invention relates to tone control circuits and, more particularly, to transistor tone control circuits in which the bass frequency and treble frequency responses are independently controllable.

Tone control circuits are utilized to control the frequency responses of audio circuit arrangements. In high fidelity audio equipment, two separate controls are generally provided; one to control the bass frequency response of the equipment, and the other to control the treble frequency response of the equipment. In order to avoid interaction between the bass and treble responses when one is adjusted and thereby to effectively provide independently functioning controls, vacuum tube circuit arrangements have heretofore been utilized.

The problem of inter-action between the bass and treble responses occurs because of the change of input impedance of the amplifying components utilized in the tone control circuits with changes in load. This effect which is known as the Miller effect occurs in vacuum tube circuits and a similar effect occurs in transistor circuits. In vacuum tube circuits the effect can be readily compensated, with the compensation being usually provided by an un-bypassed cathode resistor which provides negative current feedback to counteract the changes in input impedance due to changes in load and, therefore, inter-action between the two tone control stages due to an adjustment in one. This compensation is possible because of the isolation or substantially infinite impedance between the grid and the plate of the vacuum tube at audio frequencies.

Transistors have heretofore not been utilized in such circuits in spite of their inherent advantages of small size, low power consumption, etc., because of the finite interelectrode impedances. With finite interelectrode impedances, the dependence of input impedance upon load is substantial and, in fact, an impedance change any place in the circuit is reflected throughout the rest of the circuit. To illustrate this inter-action, when two similar transistor amplifiers are cascaded, the gain provided by the second is usually much smaller than of the first due to difference in input impedance at the second amplifier resulting from the coupled presence of the first amplifier.

In the specific illustrative embodiment of this invention, independent control, avoiding tone changing interaction between bass and treble sections of a tone control circuit, is achieved by utilizing transistor circuit arrangements for both the amplifying and isolating functions. The tone control circuit includes two cascaded amplifying sections each including a junction transistor. The first transistor is utilized as part of the bass control section and the second transistor is utilized as part of the treble control section. In each of the sections, the frequency response is controlled by means of an adjustable feedback arrangement coupled from the collector of the respective transistor back to its base electrode.

In the bass control section, the feedback arrangement provides for an attenuation of the lower frequencies in the audio frequency band and, conversely, in the treble control section, the negative feedback attenuating signals are the higher frequencies of the audio-frequency band. Actually, therefore, in order to provide, for example, for a boost of the bass frequency signals, the amount of attenuation of the lower frequency signals is reduced. Inter-action at the cross-over frequency between the treble and the bass response bands is avoided by reducing the gain at the cross-over frequency to unity and maintaining unity as zero reference regardless of changes in the treble or bass response. With unity gain, any change in impedance is not reflected in a change in gain with frequency. The gain at the cross-over frequency is therefore held constant regardless of the bass or treble control settings.

In addition to the adjustable feedback arrangements in each of the two sections, each section includes a capacitive degenerating circuit arrangement which is coupled to the emitter electrode of the respective transistor. In each of the control sections, the degenerating arrangement coupled to the emitter electrode reduces the effective gain of the control section at the cross-over frequency to unity. In the bass control section, the degeneration provided by the emitter circuit arrangement is less degenerative than that provided by the emitter arrangement in the treble control section. Due, however, to the fact that the feedback arrangement in the bass control section also degenerates the bass frequency signals, the combined degeneration due to the emitter and feedback arrangements also reduces the effective gain at the cross-over frequency through the bass control section to unity. The relative amounts of degeneration are further complicated because the gain provided by the second section is less than that provided by the first section due to the coupled effect of the first section on the input impedance of the second.

As either of the two sections is adjusted to adjust its respective response, the change of impedance is reflected in the other section. The change of impedance has two opposite effects in the other section which counteract and cancel each other. These counteracting effects relate to changes in the gain of the other section particularly at the cross-over frequency. The two counter-acting effects are due on one hand to the effect of the finite inter-electrode impedances of the transistors and on the other hand to the effect of the degenerating arrangement in the emitter circuits. Due to the counter-action of these two effects, the frequency response through one of the two sections is not affected by a change of impedance of the other.

Figure 2:
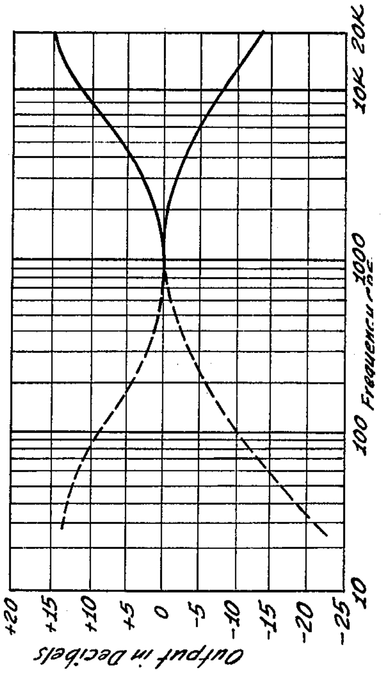

Further advantages and features of this invention will become apparent upon consideration of the following description when taken in conjunction with the drawing wherein:

FIGURE 1 is a circuit representation of the transistor tone control circuit of this invention; and FIGURE 2 is a curve illustrating the range of frequency responses provided by the tone control circuit of this invention.

Referring to FIGURE 1, audio signals in an approximate range from 50 cycles per second to 20,000 cycles per second are received at an input terminal 10 of the tone control circuit of this invention. The input terminal 10 is directly connected to the bass electrode of a PNP junction transistor 11 which functions as a current amplifying element in a bass control section 8 of the tone control circuit.

The tone control circuit as shown in FIGURE 1 includes the bass control section 8 and a treble control section 9 which together provide for the independent control of the bass and treble responses of the tone control circuit to the received audio signals. The range of frequency responses provided by the tone control circuit is illustrated in FIGURE 2 with the range of bass frequencies as controlled by the control section 8 being dashed curves and the range of treble frequencies as controlled by the treble section 9 being shown as two solid curves. Though the amplifying elements are transistors, there is no effective inter-action between the two sections 8 and 9 due to an adjustment of either section which results in a change of response of the other section.

The transistor 11 in the bass control section 8 is normally conductive, being biased by a circuit arrangement connected from ground through the serially connected resistors 13, 14 and 46 to a negative potential source 16. The base electrode of the transistor 11 is connected to the junction between the resistors 13 and 14. The emitter electrode is connected to a parallel circuit arrangement including the resistor 18 and a capacitor 19, which are, in turn, connected to ground. As is hereinafter described, the resistor 18 and the capacitor 19 function as a low-frequency degeneration circuit arrangement to prevent inter-action between the two sections 8 and 9.

Due to the current through the biasing arrangement consisting of the resistors 13 and 14, the base electrode of the transistor 11 is negative with respect to its emitter electrode. With the emitter-base junction of the transistor 11 forward biased in this manner, the transistor 11 is conductive. In the absence of input signals at the terminal 10, the main current path through the transistor 11 is from ground through the resistor 18, the transistor 11 and a resistor 17 to the source 16.

Since the transistor 11 is a junction transistor, its current amplification factor is less than one so that some of the emitter current is provided through the base electrode of the transistor 11. The current amplification factor of a transistor is the ratio of its collector current to its emitter current for a constant collector-to-base voltage. Changing the potential at the base electrode and, therefore, changing the base current, which is quite small relative to the emitter and collector currents, provides for a corresponding but larger change in the collector current.

Though the gain provided by the transistor 11 in the bass control section 8 is considerable, the bass control section 8 includes two attenuating circuit arrangements which reduce the effective gain. One is the emitter degeneration circuit arrangement consisting of the resistor 18 and the capacitor 19. This arrangement reduces the gain of the control section 8 from 40 to substantially 0 db at some frequency below a particular frequency referred to as the cross-over frequency. The cross-over frequency is at a frequency in the audio range between the effective control bandwidths of the two sections 8 and 9. The cross-over frequency, for example as indicated in FIGURE 2, may be at 1,000 cycles per second and the resistor 18 may have a resistance of 2.7 kilo-ohms and the capacitor 19 a capacitance of 0.1 microfarad.

At 1,000 cycles per second, the effective impedance presented by the capacitor 19 is approximately 1.6 kilo-ohms. The impedance presented by the capacitor 19 is inversely proportional to the frequency so that for frequencies above the cross-over frequency, the capacitor 19 shunts the resistor 18 by a smaller impedance so that substantially small potentials are developed across the resistor 18. For frequencies substantially below the cross-over frequency, the material impedance presented by the capacitor 19 causes most of the signal to appear across the resistor 18. The voltage drop across the resistor 18 is effective to reduce the emitter potential of the transistor 11. The amount of gain provided by the transistor 11 depends upon the amount of forward-biasing or the difference in potential between its emitter and base. As the frequency is reduced, the potential drop across the parallel circuit arrangement including the resistor 18 and the capacitor 19 increases to reduce the amount of forward biasing provided by any input signal amplitude.

The circuit parameters are selected so that no gain is provided at some frequency below the cross-over point. Actually, the circuit parameters are selected so that the combined gain due to the transistor 11, as offset by the degenerative effect of the emitter circuit and also as offset by the degenerative effect of an adjustable feedback arrangement coupled across the transistor 11 when centrally set, is one at the cross-over frequency. A gain of unity is the same as a gain of zero db. The adjustable feedback arrangement is hereafter described in detail.

The audio signals received at the input terminal 10 are amplified through the transistor 11 with the negative polarity portions of the input signals increasing the conduction through the transistor 11 from the emitter electrode to the collector electrode and with the positive polarity portions decreasing the conduction. The amplified output at the collector electrode of the transistor 11 is coupled through a coupling capacitor 27 to the base electrode of a junction transistor 28, which is part of the treble control section 9, and also from the collector electrode of the transistor 11 through an adjustable feedback arrangement back to the base electrode of the transistor 11.

The adjustable feedback arrangement includes a coupling capacitor 20 electrically connected to the collector electrode of the transistor 11, a resistor 22 serially connected to the capacitor 20 and a parallel circuit arrangement connected between the resistor 22 and ground including a capacitor 23 and potentiometer 24. The adjustable tap of the potentiometer 24 is electrically connected by means of a resistor 25 to the base electrode of the transistor 11. In this manner, under control of the potentiometer 24, some of the amplified audio signals which are coupled through the transistor 11 are introduced back to its base electrode.

The feedback arrangement in the bass control section 8 is a negative feedback arrangement because any change in potential at the base electrode of the transistor 11 results in an opposite change in potential at its collector electrode. For example, a positive input signal at the base electrode reduces conduction through the transistor 11 and also through the resistor 17 which is connected to the collector electrode of the transistor 11. The decrease in potential across the resistor 17 causes the potential at the collector electrode of the transistor 11 to decrease accordingly.

In other words, the transistor 11 provides for a 180 degree phase shift or a phase inversion of the input signals so that any portion of the signals appearing at the collector electrode and coupled back to the base electrode tends to counteract the effect of the original signals causing the change. The circuit parameters of the various components in the negative feedback arrangement are selected so that, effectively, the lower frequencies in the audio frequency band are coupled back to the base electrode of the transistor 11.

The capacitor 20 is a coupling capacitor having, for example, a capacitance of 10 microfarads so that both the higher and the lower frequencies of the audio frequency band are coupled through without effective attenuation. At 1,000 cycles per second, the effective impedance presented by the capacitor 20 would be only 16.67 ohms. The function of the capacitor 20 is to isolate the feedback path from the direct current potential at the collector electrode of the transistor 11. Only changes of collector potential or alternating potentials are coupled back to the base electrode.

The capacitor 23, which is much smaller than the capacitor 20, shunts some of the higher frequencies to ground. The magnitude of the signals coupled back to the base electrode of the transistor 11 in this manner varies inversely with frequency. The higher the frequency, the smaller the attenuation of the signal through the transistor 11 as controlled by the negative feedback path.

The impedance presented by the shunting capacitor 23 is greater for the lower frequencies so that effectively only the lower frequencies appear across the potentiometer 24. The setting of the potentiometer 24 determines the strength of the signals coupled to the base electrode of the transistor 11. At the lower position of the variable tap, a small fraction of the signals across the capacitor 23 is introduced to the base electrode, and at the upper position of the variable tap substantially the entire signal across the capacitor 23 is introduced to the base electrode. Depending, therefore, upon the setting of the potentiometer 24, the bass response of the audio frequency signals is varied from a maximum response when the variable tap is at its upper position to a minimum response when the variable tap is at its lower position. The maximum and minimum bass response is indicated by the upper and lower dash curves for frequencies below the cross-over frequency of 1,000 cycles per second.

The degeneration in the bass control section 8 is of the lower frequencies in both the negative feedback circuit and in the emitter parallel circuit. As hereinafter described, in the treble control section 9, the degeneration is of both the higher and lower frequencies.

As indicated above, the output signals from the bass control section 8 are coupled through the coupling capacitor 27 to the treble control section 9. The treble control section 9 includes a PNP junction transistor 28 which is biased by a circuit arrangement including the serially connected resistors 30 and 29. The biasing path is from ground through the resistors 30, 29 and 46 to the source 16. The base electrode of the transistor 28 is connected to the junction between the resistors 29 and 30 and the emitter electrode of the transistor 28 is coupled to a parallel circuit arrangement which has a configuration similar to the emitter circuit arrangement of the transistor 11.

The parallel circuit arrangement coupled to the emitter of the transistor 28 includes a resistor 33 and a capacitor 34 which have circuit parameters different from those of the resistor 18 and capacitor 19 in the section 8. The parallel circuit arrangement coupled to the emitter electrode of the transistor 28 functions in a somewhat similar manner as does the parallel circuit arrangement coupled to the emitter electrode of the transistor 11. The material degeneration, however, provided by the parallel circuit arrangement including the resistor 33 and capacitor 34 occurs at a somewhat higher frequency than does the material degeneration provided by the emitter circuit in the section 8. The overall gain provided by the treble control section 9 is, however, unity at the cross-over frequency just as is the gain provided by the bass control section 8.

In addition to the degeneration of the bass frequencies provided by the emitter parallel arrangement, a negative feedback circuit arrangement coupled from the collector electrode of the transistor 28 back to its base electrode functions to degenerate the treble frequency signals. The two degenerations, one provided by the emitter parallel arrangement and the other provided by the feedback arrangement, result in substantially unity gain at the cross-over frequency. Actually the gain that can be provided by the treble control section 9 at the cross-over frequency is somewhat less than the gain that can be provided by the control section 8 due to reduced input impedance of the control section 9 by the coupling of the control section 8. The combined degeneration provided by the control section 9 at the cross-over frequency is, therefore, less than that provided by the control section 8 though both reduce the gain to unity or zero db. In the control section 9 the degeneration at the cross-over frequency due to the emitter circuit is a much greater factor than due to the feedback arrangement. The capacitor 34, for example, may be 0.001 microfarad so that its impedance is 160 kilo-ohms at the cross-over frequency.

The current amplification through the transistor 28 is substantially similar to that through the transistor 11. The transistor 28 provides for the second phase reversal through the tone control circuit so that the audio signals coupled from the collector electrode of the transistor 28 through a coupling capacitor 44 to the output termianl 45 are substantially in phase with the original signals received at the input terminal 10.

The bias for the collector electrode of the transistor 28 is provided through a resistor 41 from the potential source 16. The negative feedback arrangement, which is also coupled to the collector electrode of the transistor 28, includes a capacitor 35 serially connected with a parallel circuit arrangement including a resistor 36 and a potentiometer 38. The other end of the resistor 36 is grounded, and the adjustable tap of the potentiometer 38 is coupled by means of a resistor 39 to the base electrode of the transistor 28.

The feedback circuit arrangement is similar to the feedback arrangement in the control section 8 except that essentially the higher frequency signals are coupled back to the base electrode of the transistor 28 instead of the lower frequency signals. The amount of degeneration of the lower frequency signals depends upon the setting of the potentiometer 38 with the degeneration increasing with frequency.

The capacitor 35 is relatively small, for example, having a capacitance of 0.01 microfarad. The impedance across the capacitor 35 varies inversely with frequency so that the magnitude of the signals appearing across the resistor 36 and the potentiometer 38 increases with frequency. The capacitor 35 effectively attenuates the lower frequency signals with the attenuation varying inversely with frequency. In other words, the strength of the signals coupled back to the base electrode of the transistor 28 for any particular setting of the potentiometer 38 increases with frequency.

At the cross-over frequency of 1,000 cycles per second, the impedance presented by the capacitor 35 is 16 kilo-ohms and the parallel impedance presented by the resistor 36 (68 kilo-ohms) and the potentiometer 38 (100 kilo-ohms) is approximately 40 kilo-ohms. The attenuation due to the capacitor 35 at the cross-over frequency is not, therefore, very substantial; but for higher frequencies the potential drop across the capacitor decreases as its impedance decreases so that the signal across the potentiometer 38 and, therefore, introduced to the base electrode, increases. In this manner, the attenuation due to the feedback loop across the transistor 28 increases substantially with frequency.

The position of the variable tap of the potentiometer 38 determines the magnitude of the signal at any given frequency which is coupled to the base electrode. At the upper position of the variable tap, the maximum signal is provided to the base electrode and at the lower position a minimum signal is provided to the base electrode.

With both the potentiometers 24 and 38 set at their central positions, the overall response provided by the tone control circuit is relatively flat over the audio frequency range with the gain being zero. In other words, the various degenerations and amplifications in the two sections 8 and 9 counteract each other throughout the audio frequency band.

When either of the control sections 8 and 9 is adjusted, utilizing respectively either of the potentiometers 24 and 38, the impedance presented by the adjusted section to the other section changes. Any change in input or output impedance presented to one of the control sections 8 and 9 affects its operation. For example, consider the various reactions throughout the tone control circuit due to an adjustment of the potentiometer 24 in the control section 8. If the variable tap is moved down, it reduces the magnitude of the signals coupled back to the base electrode of the transistor 11 and, therefore, reduces the degeneration of the bass frequency signals by the control section 8. This causes the amplitudes of the tones in the bass frequencies to increase.

The bass frequency gain is therefore improved and actually the gain even at the cross-over frequency tends to be somewhat increased by the adjustment of the potentiometer 24. The change in the gain at the cross-over frequency is, however, minor and is compensated somewhat by the increased degeneration by the emitter circuit. The gain, therefore, at the cross-over frequency by the control section 8 remains, therefore, substantially unaffected by the adjustment of the potentiometer 24.

In addition to these effects, the impedance presented by the control section 8 to the control section 9 is changed. The resistor 25 is relatively small so that moving the adjustable tap of the potentiometer 24 to a lower position decreases the parallel impedance presented by the potentiometer. Due to the finite inter-electrode impedances of the transistor 11, this change in impedance is not isolated from the control section 9.

The reduction of the impedance presented to the control section 9 tends to reduce its gain for all frequencies in the audio frequency band. At the cross-over frequency, however, the gain remains unity because the amount of attenuation by both the emitter circuit and the feedback loop in the control section 9 at the cross-over frequency is reduced. In other words, the change in impedance of the control section 8 does not affect the gain of the control section 9 at the cross-over frequency.

The treble frequency response provided by the control section 9 is also not materially affected by the change in impedance of the control section 8. Actually, the gain provided by the control section 9 changes but with less output current there is less feedback current and, therefore, less attenuation. The slope of the response at the treble frequencies remains substantially the same.

In a similar manner, changing the output impedance coupled to the control section 8 by adjusting the potentiometer 38 influences the operation of the control section 8. Decreasing the output impedances increases the load and the current provided by control section 8. The increase in current is, however, compensated for by the attenuation provided by the emitter circuit in the control section 8 at the cross-over frequency and by the attenuation in the feedback loop.

To recapitulate, the effects in the control sections 8 and 9 due to changes of impedance accompanying the adjustment of the potentiometers 24 and 38 are in part automatically compensated for by the emitter parallel circuit arrangements. In the control section 8, as the output current increases due to a change in impedance in the control section 9, to increase the gain at the cross-over frequency and at the bass frequencies, the increase in current through the emitter electrode correspondingly increases the degeneration of the bass frequency signals. The gain, therefore, at the cross-over frequency remains at zero db. Though the treble response of the control section 8 is shifted when the impedance of the control section 9 is changed, it is the treble response which is being adjusted anyhow by the potentiometer 38. The effect is therefore not deleterious to prevent any effective inter-action due to a change of impedance in the control section 9, it is avoidance of changing the cross-over and bass responses which is important.

In the control section 9, as the output current decreases to correspondingly decrease the magnitude of the cross-over frequency signal due to an adjustment of the control section 8, the reduction in current through the emitter electrode correspondingly decreases the bass frequency degeneration provided thereby. The result, therefore, is to effectively avoid any inter-action between the two control sections 8 and 9 due to an adjustment of the potentiometers 24 and 38. In the absence of the automatic compensation of the impedance change presented when either of the potentiometers 24 and 38 is adjusted, an adjustment of either the bass or treble response changes the other.

The voltage difference between the source 16 and ground is regulated by the Zener diode 42 which is shunted by a capacitor 40 and serially connected with a small resistor 46 between the source 16 and ground.

The following list illustrates the magnitudes of the parameters of the various components that may be utilized in an exemplary embodiment of the tone control circuit:

| | | |
|---|---|---|
| Transistors 11 and 28 | | Q201–2N109 |
| Resistor 13 | kilo-ohms | 3.9 |
| Resistor 14 | do | 15 |
| Battery 16 | volts | —40 |
| Resistor 17 | kilo-ohms | 10 |
| Resistor 18 | do | 2.7 |
| Capacitor 19 | microfarads | 0.1 |
| Capacitor 20 | do | 10 |
| Resistor 22 | kilo-ohms | 3.3 |
| Capacitor 23 | microfarads | 0.1 |
| Potentiometer 24 | kilo-ohms | 0 to 100 |
| Resistor 25 | do | 1.4 |
| Capacitor 27 | microfarads | 10 |
| Resistor 29 | kilo-ohms | 39 |
| Resistor 30 | do | 58 |
| Resistor 33 | do | 2.7 |
| Capacitor 34 | microfarads | 0.001 |
| Capacitor 35 | do | 0.01 |
| Resistor 36 | kilo-ohms | 68 |
| Resistor 39 | do | 1 |
| Potentiometer 38 | do | 0 to 100 |
| Capacitor 40 | microfarads | 10 |
| Resistor 41 | kilo-ohms | 6.8 |
| Resistor 46 | ohms | 270 |
| Capacitor 44 | microfarads | 10 |

Although this application has been disclosed and illustrated with reference to particular applications, the principles involved are susceptible of numerous other applications which will be apparent to persons skilled in the art. The invention is, therefore, to be limited only as indicated by the scope of the appended claims.

We claim:

1. A transistor tone control circuit for audio frequency signals, including, a first transistor amplifier including a first transistor having an emitter and a collector, first adjustable impedance means connected to the collector of the transistor in said first transistor amplifier and provided with characteristics for attenuating the lower frequencies of the audio frequency signals to selectively adjust the frequency response of said first transistor amplifier to the audio frequency signals, a degenerating circuit connected to the emitter of the transistor in said first transistor amplifier and provided with characteristics for attenuating the lower frequencies of the audio signals to set the gain of said first amplifier at a particular value at a particular frequency between the lower and the higher frequencies of the audio signals and cooperative with the adjustable impedance means to provide a particular gain at a particular cut-off frequency and to compensate for changes in the impedance presented to the first transistor amplifier and to provide a variable impedance in accordance with the adjustment of the first impedance means and in accordance with the particular frequency of the signals, a second transistor amplifier coupled to said first transistor amplifier and including a second transistor having an emitter and a collector, the second transistor amplifier being constructed to provide a variable amplification in accordance with the variable impedance provided by the first transistor amplifier, second adjustable impedance means connected to the collector of the transistor in said second transistor amplifier and provided with characteristics for attenuating the upper frequencies of the audio frequency signals to selectively adjust the frequency response of said second transistor amplifier of the audio frequency signals, and a degenerating emitter circuit connected to the emitter of the transistor in said second amplifier and provided with characteristics for attenuating the lower frequencies of the audio signals and cooperative with the second adjustable impedance means to provide the particular gain at the particular cut-off frequency and to compensate for changes in the impedance presented to the second transistor amplifier and to provide a variable impedance in accordance with the adjustment of the second impedance means and in accordance with the particular frequency of the signals, said degenerating circuit in said second amplifier being provided with characteristics for a greater degeneration at said predetermined frequency than that provided by said degeneration circuit in said first amplifier.

2. The tone control circuit set forth in claim 1 in which the first adjustable impedance means includes a first resistance having an adjustable value and further includes a first capacitance and in which the second adjustable impedance means includes a second resistance having an adjustable value and further includes a second capacitance and in which the degenerating emitter circuit in said first amplifier includes a third resistance and a third capacitance and in which the degenerating emitter circuit in said second amplifier includes a fourth resistance and a fourth capacitance.

3. A transistor tone control circuit for audio frequency signals, including, a first transistor having base, emitter and collector electrodes, biasing means coupled to said base electrode for forward-biasing said transistor, means coupled to said base electrode for receiving the audio frequency signals, a common ground connection, an adjustable feedback loop coupled between said collector electrode and said base electrode and provided with characteristics for controlling the gain provided to the lower signal frequencies of said audio frequency signals, said adjustable loop including a potentiometer coupled between said collector electrode and said base electrode, and a first capacitor coupled from one end of said potentiometer to said common ground connection, a second transistor having base, emitter and collector electrodes, circuit means electrically coupling said collector electrode of said first transistor to said base electrode of said second transistor, biasing means coupled to said base electrode of said second transistor for forward-biasing said second transistor, a second adjustable feedback loop coupled between said collector and said base electrodes of said second transistor and provided with characteristics for controlling the gain provided to the higher signal frequencies of said audio frequency signals, said second adjustable loop including a second capacitor coupled to said collector electrode of said second transistor, a second potentiometer serially coupled with said second capacitor between said collector and base electrodes of said second transistor, a first capacitive degenerating circuit coupled to said emitter electrode of said first transistor and provided with characteristics for reducing the effective gain across said first transistor at the crossover frequency between the lower and the upper frequencies to unity and for compensating for variations in the impedance of the adjustable feedback loop and for variations in the impedance presented by said second transducer, and a second capacitive degenerating circuit coupled to said emitter electrode of said second transistor for reducing the effective gain across said second transistor at the crossover frequency between the upper and lower frequencies to unity and for compensating for variations in the impedance of the second adjustable loop and for variations in the impedance presented by the first transducer.

References Cited in the file of this patent

UNITED STATES PATENTS

| | | |
|---|---|---|
| 2,695,337 | Burwen | Nov. 23, 1954 |
| 2,882,350 | Stern et al. | Apr. 14, 1959 |
| 2,983,876 | Tongue | May 9, 1961 |

OTHER REFERENCES

Diers: "Transistorized Preamp and Control Unit," Popular Electronics, September 1958, pages 61–63.

Owens: "Hi-Fi Preamp for Easy Listening," Radio-Electronics, September 1956, pages 59, 60.